(12) United States Patent
Park et al.

(10) Patent No.: US 6,905,960 B2
(45) Date of Patent: Jun. 14, 2005

(54) METHOD OF FORMING A CONTACT IN A SEMICONDUCTOR DEVICE

(75) Inventors: Hong-Mi Park, Seoul (KR); Jong-Sik Chun, Suwon (KR); Hyeon-Deok Lee, Seoul (KR); In-Sun Park, Yongin (KR); Jong-Myeong Lee, Sungnam (KR); Ju-Cheol Shin, Seoul (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 0 days.

(21) Appl. No.: 10/657,140

(22) Filed: Sep. 9, 2003

(65) Prior Publication Data

US 2004/0053491 A1 Mar. 18, 2004

(30) Foreign Application Priority Data

Sep. 18, 2002 (KR) ........................................ 2002-57046

(51) Int. Cl.[7] .............................................. H01L 21/44
(52) U.S. Cl. .................... 438/653; 438/627; 438/628; 438/643; 438/644; 438/648; 438/654; 438/656; 438/685; 438/688
(58) Field of Search ................................ 438/653, 627, 438/628, 643, 644, 648, 654, 685, 688, 656

(56) References Cited

U.S. PATENT DOCUMENTS

| | | | |
|---|---|---|---|
| 5,094,981 A | | 3/1992 | Chung et al. |
| 5,985,759 A | * | 11/1999 | Kim et al. .................... 438/653 |
| 6,207,558 B1 | | 3/2001 | Singhvi et al. |
| 6,344,281 B1 | * | 2/2002 | Smith et al. ................. 428/651 |
| 6,391,769 B1 | * | 5/2002 | Lee et al. .................... 438/643 |
| 6,417,094 B1 | * | 7/2002 | Zhao et al. .................. 438/627 |
| 6,429,493 B1 | * | 8/2002 | Asahina et al. ............. 257/382 |
| 2002/0180043 A1 | * | 12/2002 | Asahina et al. ............. 257/751 |

FOREIGN PATENT DOCUMENTS

| | | |
|---|---|---|
| JP | 10064902 | 6/1998 |
| KR | 1998-82870 A | 12/1998 |

* cited by examiner

*Primary Examiner*—Bradley Baumeister
*Assistant Examiner*—Victor V Yevsikov
(74) *Attorney, Agent, or Firm*—Volentine Francos & Whitt,pllc

(57) ABSTRACT

In a method of forming a contact in a semiconductor device, an insulating layer is formed on the semiconductor substrate. Then, a contact hole is formed by selectively etching the insulating layer. A barrier metal layer is deposited on side and bottom surfaces of the contact hole and on a top surface of the insulating layer to a uniform thickness. A wetting layer of an oxidation-resistive metal material is deposited on the barrier metal layer. A metal layer is formed on the wetting layer and fills the contact hole to thereby form a contact in the semiconductor device.

13 Claims, 6 Drawing Sheets

METHOD OF FORMING A CONTACT IN A SEMICONDUCTOR DEVICE

BACKGROUND OF THE INVENTION

1. Field of the Invention

The present invention generally relates to the fabrication of semiconductor devices, and more particularly, the present invention relates to the formation of a contact having a high aspect ratio in a semiconductor device.

2. Description of the Related Art

Current information media and computer technologies demand higher operating speeds and larger storage capacities from semiconductor devices. Accordingly, developments continue in an effort to improve the integration degree, reliability, and the response speed of the semiconductor devices.

To increase the degree of integration of integrated circuits (ICs) on a semiconductor chip, it has become necessary to form ultra-fine conductive patterns in which the width of conductive lines and the width of conductive contacts penetrating insulating layers are decreased. As a result, the aspect ratios of the contacts penetrating the insulating layers have substantially increased.

Physical vapor deposition (PVD) processes have been widely used to fill contact holes with metal materials so as to form contacts. However, it is generally difficult to completely fill (i.e., without voids) a contact hole of a high aspect ratio using a PVD process.

Accordingly, in an effort to completely fill of a contact hole, a wetting layer can be used to improve adhesive characteristics and re-flow characteristics of the metal fill-material. In this case, the metal material is filled into the contact hole and then reflowed by heat treatment. Also, in this type of process, a barrier layer is deposited to prevent the metal material from diffusing into the insulating layer during the re-flow process.

It is difficult, however, to deposit a barrier layer and a wetting layer at a uniform thickness in contact holes having high aspect ratios. In addition, barrier layers and wetting layers have limited effectiveness in improving adhesion and re-flow characteristics of the metal material and in preventing the metal material from diffusing. Therefore, even in the case where barrier layers and wetting layers are utilized, it is still difficult to completely fill high aspect ratio contact holes without voids.

Examples of methods for forming metal wiring lines including barrier layers and/or wetting layers are disclosed in U.S. Pat. Nos. 6,207,558 (issued to Singhvi et. al.) and 5,094,981 (issued to Chung et. al.).

U.S. Pat. No. 6,207,558 discloses a method of forming a metal wiring line in which a combination barrier-wetting layer is formed to include tantalum, a tantalum nitride layer, tungsten, a tungsten nitride layer or a combination thereof. The method disclosed in U.S. Pat. No. 6,207,558 has an advantage in that the metal wiring line process can be simplified since the barrier-wetting layer functions both as a barrier layer to prevent the metal material from diffusing into a dielectric body and as a wetting layer to improve deposition characteristics of the metal material. It has been found, however, that the barrier properties of the barrier-wetting layer are not always sufficient to prevent the diffusion of metal material into the dielectric.

According to U.S. Pat. No. 5,094,981, a titanium layer is deposited on a structure which includes a contact hole, and then a highly heat-resistant barrier layer, such as tungsten, is deposited on the titanium layer. A metal material is filled into the contact hole after annealing the structure to thereby complete the metal wiring line. When the contact hole makes contact with source/drain regions including impurities on a substrate, the barrier layer including the tungsten prevents the metal material filled into the contact hole from diffusing into the substrate so that the generation of the spiking is prevented. However, this technique suffers a drawback in that titanium and tungsten chemically react with one another, resulting in an increase in contact resistance.

There is a need for an improved method of filling of a contact hole (also called a via hole) having a high aspect ratio without the formation of a void in the filled contact hole.

SUMMARY OF THE INVENTION

According to an aspect of the present invention, an insulating layer is formed on a semiconductor substrate, and a contact hole is formed by selectively etching a portion of the insulating layer. Then, a barrier metal layer is formed on the insulating layer and a surface of the contact hole at a uniform thickness, and an oxidation-resistive metal material is formed as a wetting layer on the barrier metal layer. Finally, a metal layer is formed on the wetting layer so as to fill the contact hole.

The oxidation-resistive metal material is mainly comprised of tungsten. The wetting layer is deposited through a chemical vapor deposition (CVD) process or an atomic layer deposition (ALD) process. Since the wetting layer includes the oxidation-resistive material, the formation of an oxide which can deteriorate the deposition characteristics of the metal layer is avoided. In addition, the wetting layer can be deposited on a side surface and a bottom surface of the contact hole through the CVD or the ALD process, each of which exhibits good step-coverage. Accordingly, oxidation and non-uniformity of the wetting layer are avoided to thereby prevent the formation of a void in the metal material filling the contact hole.

BRIEF DESCRIPTION OF THE DRAWINGS

The above and other objects, features and advantages of the present invention will become readily apparent from the detailed description that follows, with reference to the accompanying drawings, in which.

DETAILED DESCRIPTION OF THE PREFERRED EMBODIMENTS

Hereinafter, preferred embodiments of the present invention will be described in detail with reference to accompanying drawings.

FIGS. 1A to 1E are cross sectional views for explaining a method of forming a contact structure of a semiconductor device according to a first embodiment of the present invention.

Figure 1A:
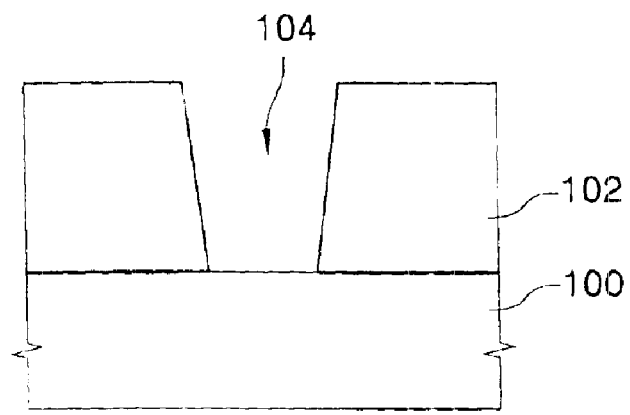
FIGS. 1A to 1E are cross sectional views for explaining a method of forming a contact structure of a semiconductor device according to a first embodiment of the present invention.

Referring to FIG. 1A, an insulating layer 102 is deposited on a substrate on which semiconductor devices are formed.

Then, a photoresist pattern (not shown) is formed on the insulating layer 102, and the insulating layer 102 is etched using the photoresist pattern as the etching mask. In this manner, a contact hole 104 is formed which exposes a conductive pattern or a predetermined region of the substrate, such as a source or drain region.

Figure 1B:
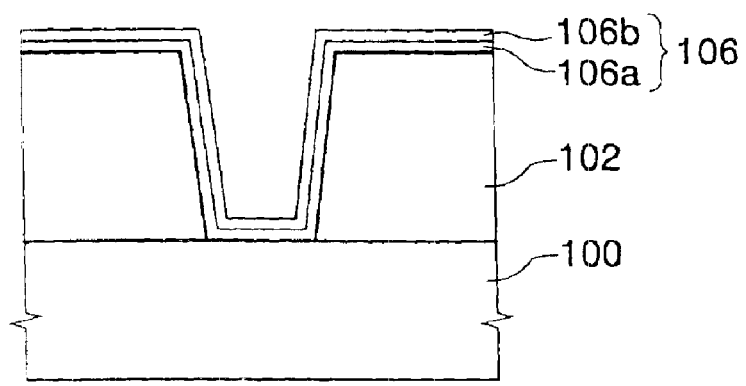

Referring to FIG. 1B, a barrier metal layer 106 is deposited on the side and bottom surface of the contact hole 104 and on a top surface of the insulating layer 102. The barrier metal layer 106 is deposited to such a thickness that sufficient space remains in the contact hole 104 for the later-deposited metal material of the metal wiring lines. The barrier metal layer 106 functions generally to prevent the metal material that is filled into the contact hole 104 from diffusing into the insulating layer 102 during a re-flow process. Preferably, the barrier metal layer 106 exhibits good adhesive properties, low contact resistance, high thermal and mechanical stress resistance, and low electrical conductivity.

Examples of suitable barrier metal layers include a titanium layer, a titanium nitride layer or a composite layer of titanium and titanium nitride. Preferably, however, the barrier metal layer is the composite layer of a titanium layer 106a and a titanium nitride layer 106b. The titanium layer 106a prevents the diffusion of deposited metal material into the insulating layer 102. Titanium, however, can easily react with the deposited metal to form high resistance reaction products on a boundary surface. For this reason, the titanium nitride layer 106b is deposited which reacts very little with the deposit metal material. Accordingly, the composite layer of the titanium layer 106a and the titanium nitride layer 106b can efficiently prevent the formation of reaction products and the diffusion of deposited metal material into the insulating layer 102.

As mentioned above, the barrier metal layer 106 is deposited to such a thickness that sufficient space remains in the contact hole 104 for the later-deposited metal material of the metal wiring lines. Preferably, the titanium layer 106a is deposited to a thickness of 100 Å to 500 Å, and the titanium nitride layer 106b is deposited to a thickness of 100 Å to 1000 Å. When a thickness of the titanium layer 106a and the titanium nitride layer 106b is too great, a contact resistance of the contact is increased since the electrical resistance of the titanium layer 106a and the titanium nitride layer 106b is much higher than that of the conductive contact material. When the thickness of the titanium layer 106a and the titanium nitride layer 106b is too small, the diffusion of deposited metal material and the creation of reaction products cannot be efficiently prevented.

Preferably, the titanium layer and the titanium nitride layer are deposited by a physical vapor deposition (PVD) process. According to the PVD process, accelerated particles collide with a target plate and metal particles are emitted from the target to thereby deposit a metal layer on a surface of the substrate. Here, titanium is used for the target plate.

In more detail, to deposit the titanium layer 106a, titanium is used for the target plate and an argon gas is used as an ambient gas in the chamber. Here, a pressure of a few mtorr and a power of ten to several tens of kW are applied to the chamber. To deposit the titanium nitride layer 106b, titanium is used for the target plate and an argon gas is used as an ambient gas in the chamber. A nitrogen gas is also provided to react with the titanium. Here, a pressure of a few mTorr and a power of ten to several tens are kW are applied to the chamber.

Figure 1C:
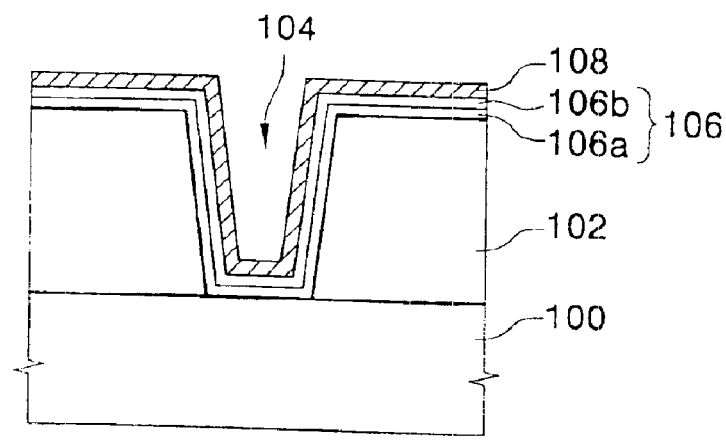

Referring to FIG. 1C, a wetting layer 106 of an oxidation-resistive metal material is deposited on the barrier metal layer 106. The oxidation-resistive metal material of the first embodiment of the present invention includes a tungsten-based material such as a tungsten (W) material or a tungsten silicide (WSix). The wetting layer 108 is deposited to such a thickness that sufficient space remains in the contact hole 104 for the later-deposited metal material of the metal wiring lines.

The wetting layer 108 functions to improve the reflowability of the metal material deposited in a subsequent process, thereby facilitating the metal material reflow into the contact hole 104 and enhancing the adhesive property of the metal material.

Preferably that the wetting layer 108 is continuously and uniformly formed on the barrier metal layer 106. If the wetting layer 108 is discontinuously formed on the barrier metal layer 106 to expose a portion of the barrier metal layer 106, the metal material may not properly reflow at the exposed portion of the barrier metal layer, and a void-type defect may result. Further, it is preferable that the wetting layer 108 is deposited to a sufficiently small thickness that the remaining portion of the contact hole 104 is large enough to achieve filling by the metal material. Accordingly, the wetting layer 108 preferably is formed of a material having good step coverage and is deposited through a process having good step coverage. Furthermore, it is preferable that the wetting layer 108 is formed of a material that does not react well with oxygen. A variety of experimental results performed by the present inventors show that if the wetting layer 108 is easily reacted with ambient oxygen, native oxides are created on the surface of the wetting layer 108. These oxides on the surface of the wetting layer 108 generally prevent the metal material from smoothly reflowing, which in turn can create void-type defects. In addition, it is preferable that the wetting layer 108 is formed at a low temperature to prevent underlying layers from being damaged by heat.

To realize the above characteristics, the wetting layer 108 is formed of tungsten which preferably deposited by CVD or ALD processes. The CVD or ALD process is preferable over the PVD process so as to improve the step coverage of the wetting layer 108. The wetting layer 108 is generally deposited to a thickness of 10 Å to 1000 Å, which ensures continuous and uniform deposition of the wetting layer 108 and reflowability of the metal material deposited in a subsequent process. However, the thickness of the wetting layer 108 is preferably no so great as to prevent later deposition of the metal material within the contact hole 104.

When the tungsten is deposited through the CVD process, tungsten hexafluoride (WF6) gas and silane (SiH4) gas can be used as a source gas. For example, tungsten hexafluoride (WF6) gas of 10 sccm to 300 sccm and silane (SiH4) gas of 10 sccm to 100 sccm may be supplied to the chamber. As a preferred embodiment of the present invention, the deposition process is carried out at a temperature of about 300° C. to about 550° C. under the pressure of 1 to 400 Torr.

Tungsten reacts slowly with oxygen as compared with the titanium or titanium nitride of the conventional wetting layer, and as a result, void-type defects otherwise caused by oxides on the surface of the wetting layer can be decreased. To avoid oxide formation when using a titanium or titanium nitride wetting layer, the wetting layer and metal material deposition processes are carried out in a continuous vacuum. However, in the case of a tungsten wetting layer, the reflowability of the metal material is so good even if a continuous vacuum is not maintained during the wetting layer and metal material deposition processes. Accordingly, the process efficiency can be increased and the manufacturing cost can be lowered.

The conventional wetting layer of titanium or titanium nitride is deposited through a PVD process. As a result, step coverage of the wetting layer is poor, which makes it difficult to deposit the wetting layer at a uniform and thin thickness. The conventional wetting layer of titanium or titanium nitride can not be readily deposited through a CVD process so as to improve step coverage, since underlying layers can be damaged by heat since the deposition temperature exceeds about 700° C. in the CVD process. On the other hand, tungsten can be deposited at a relatively low temperature of 300° C. to 550° C. using a CVD or ALD process, thus allowing for the use of these processes which exhibit greater step coverage. Accordingly, a thin and uniform layer can be deposited in the contact hole.

Figure 1D:
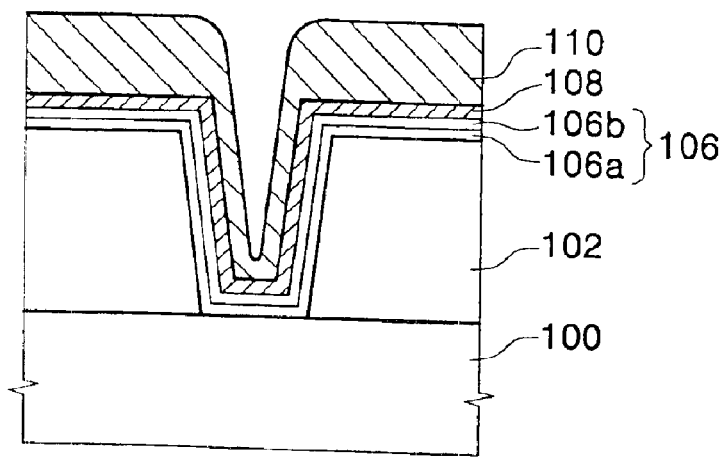

Referring to FIG. 1D, an aluminum layer 110 is deposited on the wetting layer 108 by a CVD or PVD process. A dimethylaluminum hydride (DMAH) gas, a dimethylethylamine alane (DMEAA) gas, or a methylpyrrolidine alane (MPA) gas may be used as a source gas. The depositing of the aluminum layer 110 may be carried out at a temperature of about 100° C. to about 400° C. under the pressure of about 0.1 Torr to about 20 Torr. An argon gas may be added into the processing chamber as an ambient gas.

Examples of a PVD process include a direct current sputtering process, an alternative current sputtering process, and a direct current magnetron sputtering process. The aluminum layer 110 is preferably deposited in such a manner that the contact hole is not completely filled up prior to a subsequent re-flow process.

Figure 1E:
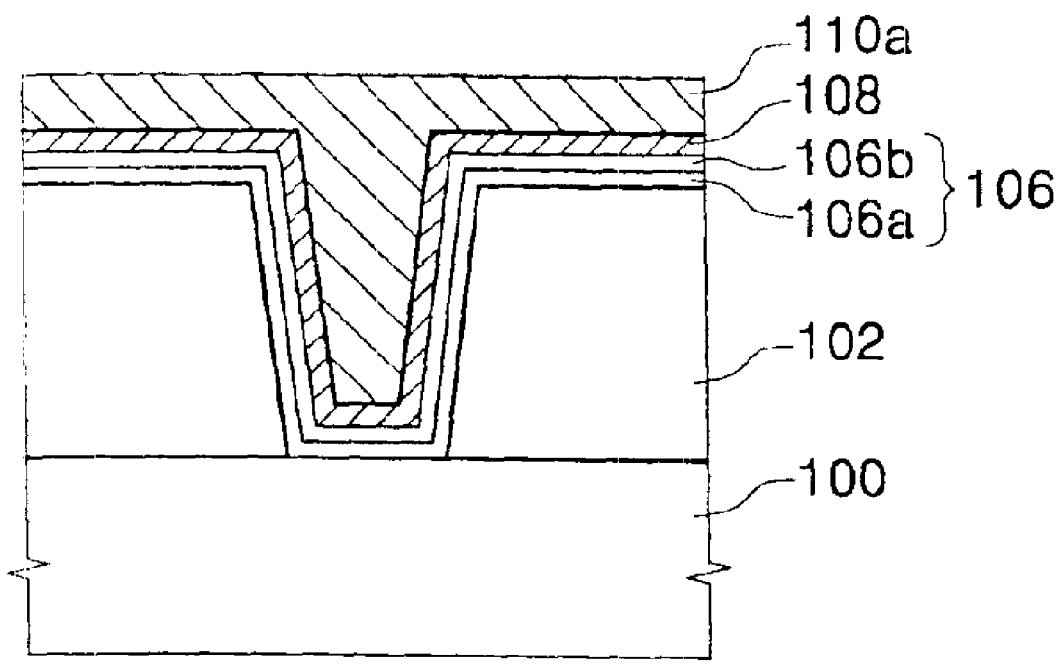

Referring to FIG. 1E, the aluminum layer 110 is re-flowed by subjecting the substrate to heat treatment at a temperature of 400° C. to 550° C. for several seconds to several hundreds of seconds. Here, the re-flow process is carried out in a vacuum state to prevent oxidation on a surface of the aluminum layer 110. Then, the aluminum layer 110 is planarized after completely filling the contact hole. Since little or no oxides are formed on the tungsten containing wetting layer 108, the reflow process is highly effective in filling a contact hole of a high aspect ratio without void-type defects.

FIGS. 2A to 2E are cross sectional views showing a method of forming a contact structure of a semiconductor device according to a second embodiment of the present invention. The method of the second embodiment differs from that of the first embodiment with respect to the manner in which the aluminum layer is deposited.

Figure 2A:
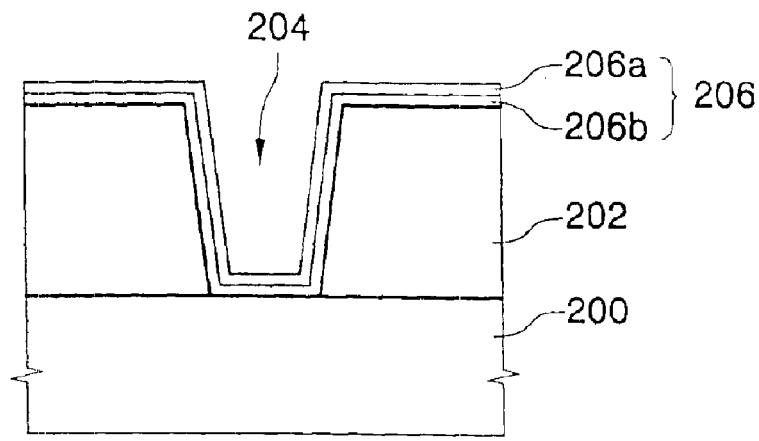
FIGS. 2A to 2E are cross sectional views for explaining a method of forming a contact structure of a semiconductor device according to a second embodiment of the present invention.

Referring to FIG. 2A, an insulating layer 202 including a contact hole 204 is formed on the semiconductor substrate 200, and a barrier metal layer 206 including a titanium layer 206a and a titanium nitride layer 206b is formed on a side surface and bottom surface of the contact hole 204 and on a top surface of the insulating layer 202. The insulating layer 202 and the barrier metal layer 206 are formed by the same manner as described in the first embodiment with to FIGS. 1A to 1C.

Figure 2B:
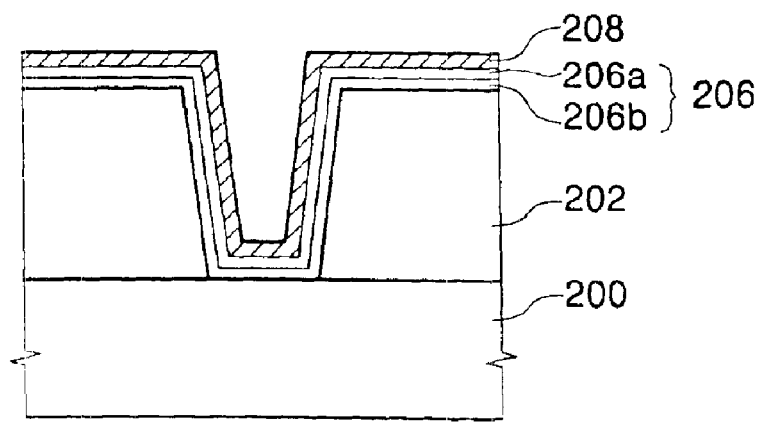

Referring to FIG. 2B, a wetting layer 208 including an oxidation-resistive metal material is formed on the barrier metal layer 206. For example, the oxidation-resistive metal material may be a tungsten-based material such as tungsten or tungsten silicide.

In this embodiment, the wetting layer 208 can be formed to a thickness of 10 Å to 1000 Å, which ensures continuous and uniform deposition of the wetting layer 108 as well as reflowability of the metal material deposited in a subsequent process. Further, the wetting layer 208 is preferably deposited to such a thickness that the contact hole 204 is only partially filled up to thereby leave a space in the contact hole 204 for the metal material of the metal wiring lines, and more preferably is formed to be so thin that a metal material is sufficiently filled into the contact hole 204. Since the wetting layer is to be uniformly deposited on the inner surface of the contact hole 204 of a high aspect ratio, a CVD process or an ALD process is performed for depositing the wetting layer 208.

Figure 2C:
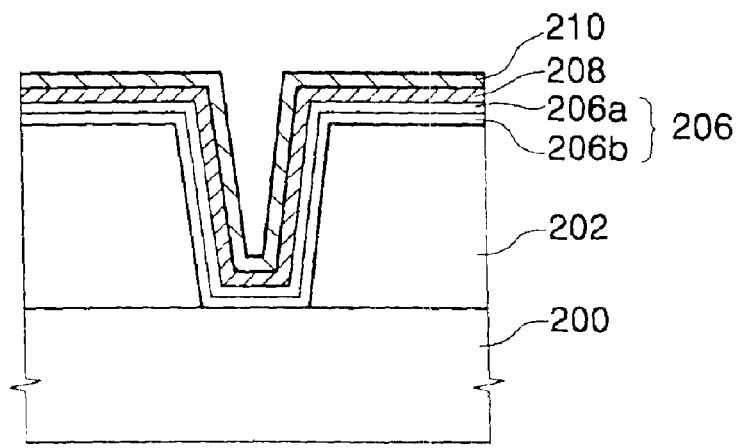

Referring to FIG. 2C, a first aluminum layer 210 is deposited on the wetting layer through the CVD process. The CVD process is carried out using a dimethylaluminum hydride (DMAH) gas, a dimethylethylamine alane (DMEAA) gas, or a methylpyrrolidine alane (MPA) gas as a source gas at a temperature of about 100° C. to about 400° C. under a pressure of 0.1 Torr to 20 Torr. An argon gas can be added into a processing chamber of the CVD as an ambient gas.

The first aluminum layer 210 has a good step coverage as compared with an aluminum layer deposited by a PVD process, so that the first aluminum layer 210 can be deposited on a top surface of the wetting layer 208 with a uniform thickness even though the aspect ratio of the contact hole 204 is high. Further, an oxidized substance impeding the deposition of the first aluminum layer 210 is hardly created on the top surface of the wetting layer 208, and therefore the first aluminum layer 210 can be continuously deposited on the top surface of the wetting layer 208. Here, the first aluminum layer 210 is also deposited to such a thickness that the contact hole 204 is partially filled up to thereby form a space in the contact hole 204.

Figure 2D:
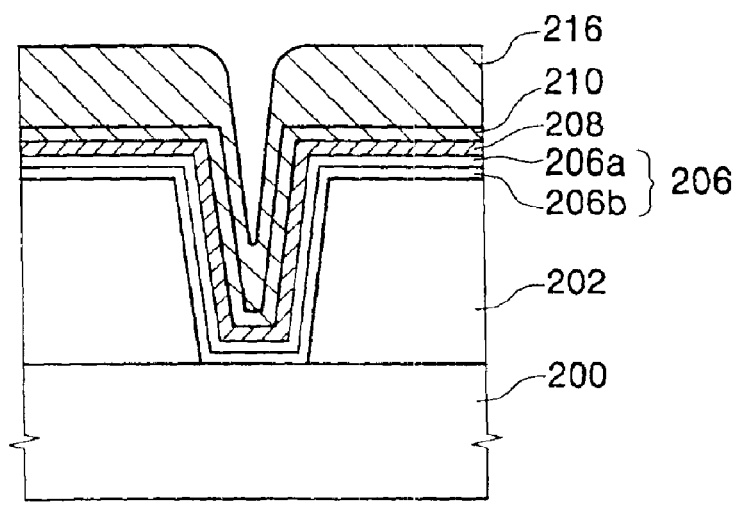

Referring to FIG. 2D, a second aluminum layer 216 is deposited on the first aluminum layer 210 by a PVD process. Examples of the PVD process are a direct current sputtering process, an alternative current sputtering process, or a direct current magnetron process. The second aluminum layer 216 is preferably deposited in such a manner that the contact hole 204 is not completely filled up prior to a subsequent re-flow process.

If both the first and second aluminum layers 216 are deposited by a CVD process, the deposition time is increased, which reduces productivity. On the other hand, if both the first and the second aluminum layers are deposited by a PVD process, the step coverage of the aluminum layers is poor. Accordingly, in the present embodiment, the first aluminum layer 210 is uniformly deposited on the wetting layer 208 by the CVD process, and then the second aluminum layer 216 is deposited on the first aluminum layer 210 by the PVD process.

Figure 2E:
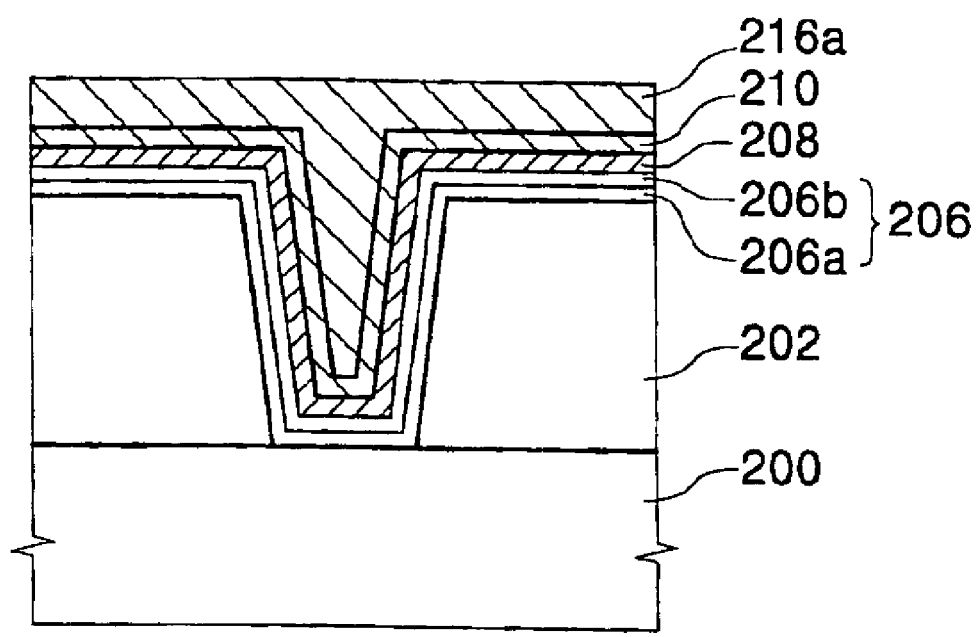

Referring to FIG. 2E, the substrate including the first and second aluminum layer 210 and 216 is subjected to heat treatment at a temperature of 400° C. to 550° C., so that the first and second aluminum layers are re-flowed. The re-flowed first and second aluminum layers are completely filled up into the contact hole and then planarized, thus forming a contact of a high aspect ratio without voids.

According to the present invention, the wetting layer is formed of an oxidation-resistive material, thereby minimizing the formation of an oxidized substance which might otherwise impede the deposition of the aluminum layer on a top surface of the wetting layer. Therefore, void-type defects and non-complete filling of the metal material into the contact hole can be prevented.

While the present invention has been described in detail with reference to the preferred embodiments thereof, it should be understood to those skilled in the art that various changes, substitutions and alterations can be made hereto without departing from the scope of the invention as defined by the appended claims.

What is claimed is:

1. A method of forming a contact in a semiconductor device, comprising:

forming an insulating layer on a semiconductor substrate;

forming a contact hole in the insulating layer by selectively etching a portion of the insulating layer;

forming a barrier metal layer having a uniform thickness on the insulating layer and a surface of the contact hole;

forming a wetting layer of an oxidation-resistive metal material of tungsten on the barrier metal layer by a chemical vapor deposition (CVD) process or an atomic layer deposition (ALD) process, wherein a metal of the wetting layer is different than a metal of the barrier layer; and forming a metal layer on the wetting layer so as to fill the contact hole.

2. The method of forming a contact in a semiconductor as claimed in claim 1, wherein the wetting layer is formed by a an atomic layer deposition (ALD) process.

3. The method of forming a contact in a semiconductor as claimed in claim 1, wherein the wetting layer is formed at a temperature of about 350° C. to about 550° C.

4. The method of forming a contact in a semiconductor as claimed in claim 1, wherein the wetting layer is formed to a thickness of about 10 Å to about 1000 Å.

5. The method of forming a contact in a semiconductor as claimed in claim 1, wherein the wetting layer is formed to such a thickness that sufficient spare remains in the contact hole for the metal layer.

6. The method of forming a contact in a semiconductor as claimed in claim 1, wherein the barrier metal layer includes a titanium layer, a titanium nitride layer or a composite layer thereof.

7. The method of forming a contact in a semiconductor as claimed in claim 6, wherein the barrier metal layer is formed by a physical vapor deposition (PVD) process, a chemical vapor deposition (CVD) process, or an atomic layer deposition (ALD) process.

8. The method of forming a contact in a semiconductor as claimed in claim 1, wherein the barrier metal layer is formed to such a thickness that sufficient space remains in the contact hole for the wetting layer and the metal layer.

9. The method of forming a contact in a semiconductor as claimed in claim 1, wherein the metal layer is formed by:

depositing a metal material on the wetting layer to such a thickness that the contact hole is partially filled; and re-flowing the deposited metal material to completely fill the contact hole.

10. The method of forming a contact in a semiconductor as claimed in claim 9, wherein the metal material is deposited through a chemical vapor deposition (CVD) process or a physical vapor deposition (PVD) process.

11. The method of forming a contact in a semiconductor as claimed in claim 1, wherein the metal layer is formed by:

depositing a first metal material on the wetting layer by a chemical vapor deposition (CVD) process to such a thickness that the contact hole is partially filled with the first metal material;

depositing a second metal material on the first metal material by a physical vapor deposition (PVD) process; and re-flowing the first metal material and the second metal material to completely fill the contact hole.

12. The method of forming a contact in a semiconductor as claimed in claim 11, wherein the first metal material is the same as the second metal material.

13. The method of forming a contact in a semiconductor as claimed in claim 1, wherein the metal layer includes aluminum or an aluminum alloy.

* * * * *